(12) United States Patent
Kim (10) Patent No.: US 9,347,646 B2
(45) Date of Patent: May 24, 2016

(54) LIGHT EMITTING DEVICE PROVIDING CONTROLLED COLOR RENDITION

(71) Applicant: SAMSUNG ELECTRONICS CO., LTD., Gyeonggi-do (KR)

(72) Inventor: Yong Tae Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 287 days.

(21) Appl. No.: 13/756,344

(22) Filed: Jan. 31, 2013

(65) Prior Publication Data

US 2013/0194794 A1   Aug. 1, 2013

(30) Foreign Application Priority Data

Feb. 1, 2012   (KR) .................. 10-2012-0010305

(51) Int. Cl.
*F21V 9/00*   (2015.01)
*H01L 33/50*   (2010.01)

(52) U.S. Cl.
CPC ............... *F21V 9/00* (2013.01); *H01L 33/504* (2013.01); *H01L 33/508* (2013.01); *H01L 33/505* (2013.01); *H01L 2224/48091* (2013.01); *H01L 2224/48247* (2013.01)

(58) Field of Classification Search
CPC ....... F21V 9/00; H01L 33/504; H01L 33/508; H01L 33/505; H01L 2224/48091; H01L 2224/48247
See application file for complete search history.

(56) References Cited

U.S. PATENT DOCUMENTS

| 7,737,621 B2 * | 6/2010 | Masuda et al. ................. 313/501 |
| 2006/0071591 A1 * | 4/2006 | Takezawa ........... B29C 45/0013 |
| | | 313/501 |

FOREIGN PATENT DOCUMENTS

| KR | 2004-0092141 A | 11/2004 |
| KR | 2005-0098463 A | 10/2005 |
| KR | 2006-0063511 A | 6/2006 |
| KR | 2007-0070262 A | 7/2007 |
| KR | 2010-0070168 A | 6/2010 |

* cited by examiner

*Primary Examiner* — Stephen W Smoot
*Assistant Examiner* — Vicki B Booker
(74) *Attorney, Agent, or Firm* — McDermott Will & Emery LLP (57) ABSTRACT

A light emitting device for controlled color rendition includes a support unit; a luminous element mounted on the support unit; and a wavelength conversion unit formed on the support unit. The wavelength conversion unit covers the luminous element as an encapsulant containing first light wavelength converters emitting light of a first wavelength and second light wavelength converters emitting light of a second wavelength, where the first wavelength is larger than the second wavelength. The wavelength conversion unit includes a first mixture region adjacent to the luminous element and a second mixture region above the first mixture region. The first light wavelength converters are concentratively distributed in the first mixture region, and the second light wavelength converters are concentratively distributed in the second mixture region.

16 Claims, 5 Drawing Sheets

LIGHT EMITTING DEVICE PROVIDING CONTROLLED COLOR RENDITION

CROSS-REFERENCE TO RELATED APPLICATIONS

This application claims the priority to Korean Patent Application No. 10-2012-0010305, filed on Feb. 1, 2012, in the Korean Intellectual Property Office, the disclosure of which is incorporated herein by reference.

TECHNICAL FIELD

The present application relates to a light emitting device.

BACKGROUND

A semiconductor light emitting diode (LED) has been seen as a next-generation light source having advantages such as a long lifespan, low power consumption, a fast initial response speed, a high output, and the like, in comparison to traditional light sources, and as such, it has come to prominence as an advantageous light source in various products.

A light emitting device using such an LED, commonly employs a technique of using phosphors as materials for converting light emitted from an LED chip into light having a different wavelength. In particular, such a wavelength conversion technique is required for various types of illumination devices and a light emitting device for white light required for a backlight of a display device.

A related art technique of mixing colors of phosphor used in a general white light emitting device is the application of a mixture obtained by mixing a single yellow phosphor with a transparent liquid resin such as silicon, epoxy, or the like, to the periphery of an LED chip through a certain method such as a dispensing method, or the like.

Thus, phosphors are randomly distributed at the periphery of the LED chip during the process of curing the liquid resin, degrading a color distribution yield, inevitably resulting in the fabrication of a product having an undesirable color. In addition, luminous efficiency may be degraded.

Accordingly, a need exits to provide a light emitting device with improved color distribution yield and luminous efficiency.

SUMMARY

An aspect of the present application provides a light emitting device having improved color distribution yield, allowing color rendition (or a color rendering index (CRI)) to be easily controlled, and having improved luminous efficiency.

According to an aspect of the present application, there is provided a light emitting device including: a support unit; a luminous element disposed on the support unit; and a wavelength conversion unit disposed on the support unit to cover the luminous element as an encapsulant containing first light wavelength converters emitting light of a first wavelength and second light wavelength converters emitting light of a second wavelength. The first wavelength is larger than the second wavelength. The wavelength conversion unit includes a first mixture region adjacent to the luminous element and a second mixture region above the first mixture region. The first light wavelength converters are concentratively distributed in the first mixture region, and the second light wavelength converters are concentratively distributed in the second mixture region.

The wavelength conversion unit may have different distribution gradients in the first and second mixture regions due to a difference in deposition rates of the first light wavelength converters and the second light wavelength converters contained in the encapsulant.

The first light wavelength converters and the second light wavelength converters may be deposited to have different depths according to an average grain size of each of the light wavelength converters, and average grain sizes of the first light wavelength converters and the second light wavelength converters may be selected according to the magnitude of a specific gravity value of each of the first light wavelength converters and the second light wavelength converters.

The first light wavelength converters may have a specific gravity value ranging from 3.0~4.0 g/cm$^3$, and the second light wavelength converters may have a specific gravity value ranging from any one of 3.0~4.0 g/cm$^3$, 4.5~5.5 g/cm$^3$, and 6.0~7.0 g/cm$^3$.

An average grain size of the first light wavelength converters may be selected from within a range of 10 μm to 30 μm, and an average grain size of the second light wavelength converters may be selected from within a range of 0.1 μm to 10 μm.

When the specific gravity value of the first light wavelength converters ranges from 3.0~4.0 g/cm$^3$, the average grain size of the first light wavelength converters may be selected from a range of 10 μm to 30 μm, and when the specific gravity value of the second light wavelength converters ranges from 3.0~4.0 g/cm$^3$ the average grain size of the second light wavelength converters may be selected from a range of 0.1 μm to 10 μm, and when the specific gravity value of the second light wavelength converters ranges from 4.5~5.5 g/cm$^3$ and 6.0~7.0 g/cm$^3$, the average grain size of the second light wavelength converters may be selected from a range of 0.1 μm to 5 μm.

The first light wavelength converters may include (Sr,Ca)AlSiN and Ca-α-SiAlON, and the second light wavelength converters may include β—SiAlON, (Sr,Ba)$_2$SiO$_4$, and Lu$_2$Al$_5$O$_{12}$.

The support unit may include a substrate with an electrode formed thereon, and the luminous element may be placed on the substrate and connected to the electrode.

The support unit may include a main body with a cavity formed therein and a lead frame exposed within the cavity, wherein the luminous element may be placed in the cavity and connected to the lead frame.

In another aspect, a light emitting device is provided. The light emitting device includes a support unit including a main body and cavity formed therein. A luminous element is disposed within the cavity. A wavelength conversion unit substantially fills the cavity. The wavelength conversion unit is disposed on the support unit to cover the luminous element as an encapsulant containing first light wavelength converters emitting light of a first wavelength and second light wavelength converters emitting light of a second wavelength. The first wavelength is larger than the second wavelength. The wavelength conversion unit includes a first mixture region adjacent to the luminous element and a second mixture region above the first mixture region. The first light wavelength converters are concentratively distributed in the first mixture region, and the second light wavelength converters are concentratively distributed in the second mixture region.

In yet another example, a light emitting device is provided. The light emitting device includes a support unit including a main body and cavity formed therein. A luminous element is disposed within the cavity. A transparent resin unit fills a first portion of the cavity and disposed on the luminous element. A wavelength conversion unit fills a second portion of the cavity. The wavelength conversion unit is disposed on the transparent resin unit and contains first light wavelength converters emitting light of a first wavelength and second light wavelength converters emitting light of a second wavelength. The first wavelength is larger than the second wavelength. The wavelength conversion unit includes a first mixture region adjacent to the luminous element and a second mixture region above the first mixture region. The first light wavelength converters are concentratively distributed in the first mixture region, and the second light wavelength converters are concentratively distributed in the second mixture region.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Examples of the present application will now be described in detail with reference to the accompanying drawings. The application may, however, be embodied in many different forms and should not be construed as being limited to the examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like components.

A light emitting device according to an example of the present application will be described with reference to FIGS. 1 through 4.

Figure 1:
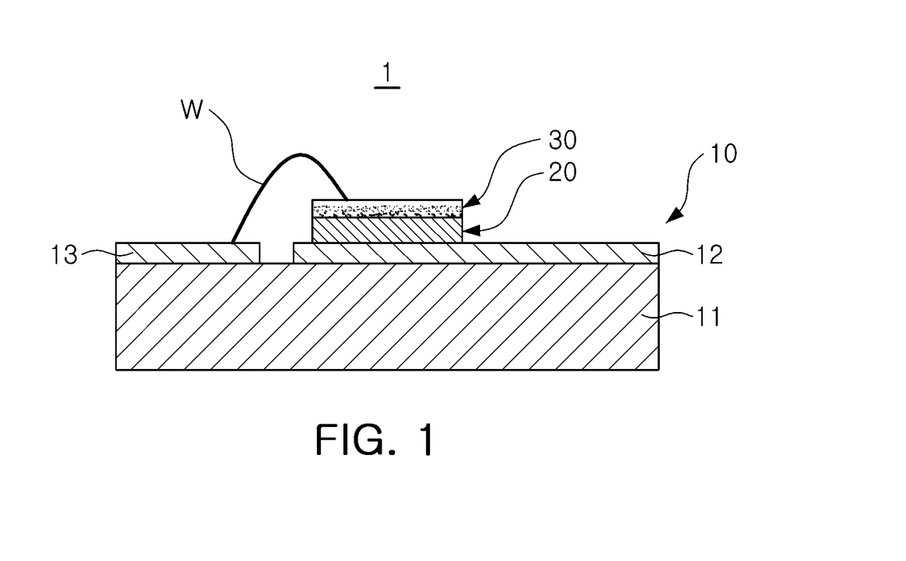
FIG. 1 is a cross-sectional view schematically showing a light emitting device according to an example of the present application.
Figure 2A:
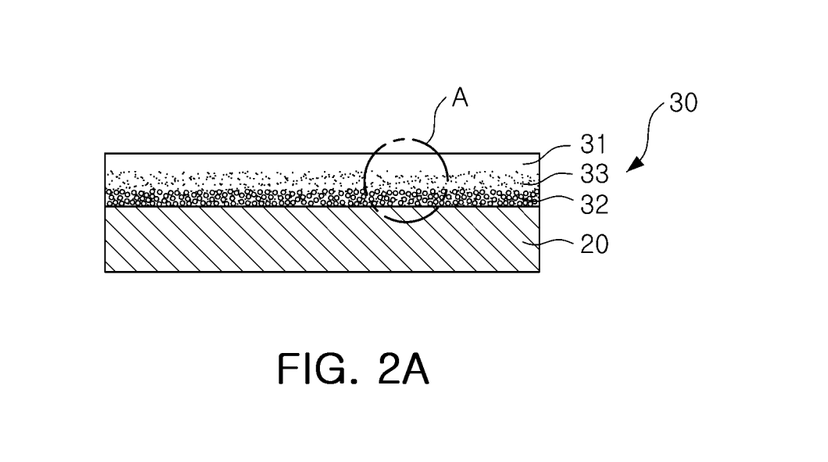
FIGS. 2A and 2B are cross-sectional views schematically showing a structure of a luminous element and a wavelength conversion unit in the light emitting device of FIG. 1.
Figure 2B:
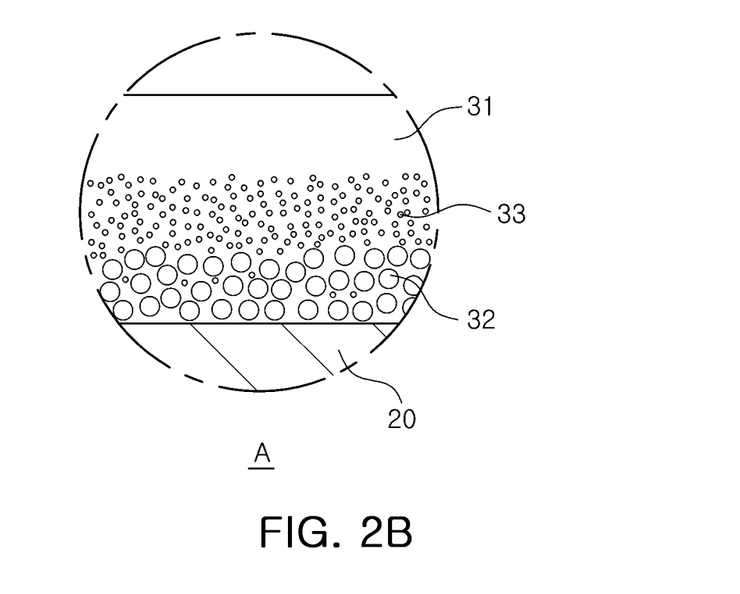
Figure 3:
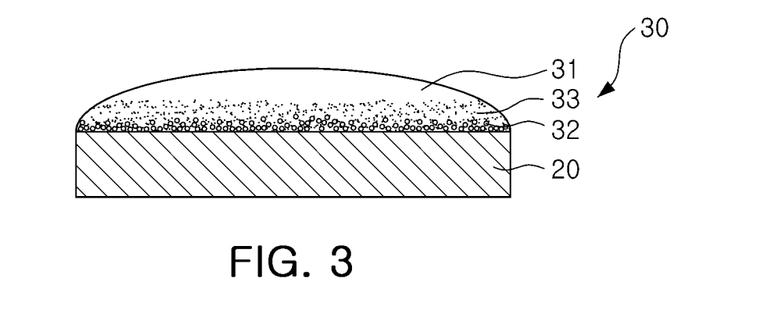
FIG. 3 is a cross-sectional view schematically showing a modification of the wavelength conversion unit in FIG. 2.
Figure 4:
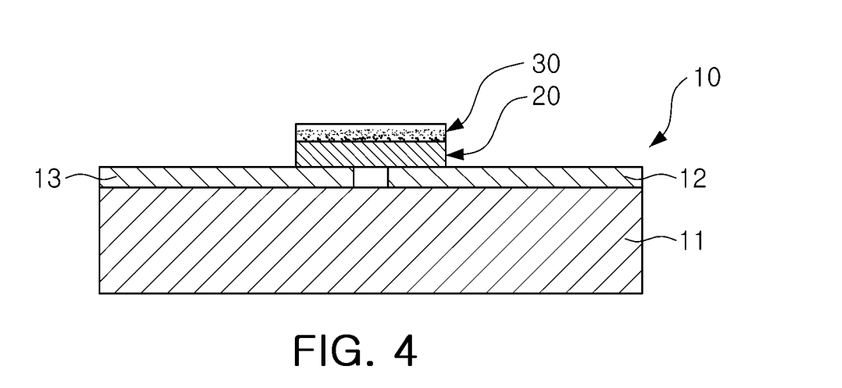
FIG. 4 is a cross-sectional view schematically showing a modification of the light emitting device of FIG. 1.

FIG. 1 is a cross-sectional view schematically showing a light emitting device according to an example of the present application. FIGS. 2A and 2B are cross-sectional views schematically showing a structure of a luminous element and a wavelength conversion unit in the light emitting device of FIG. 1. FIG. 3 is a cross-sectional view schematically showing an example of the wavelength conversion unit in FIG. 2. FIG. 4 is a cross-sectional view schematically showing an example of the light emitting device of FIG. 1.

With reference to FIGS. 1 and 2, a light emitting device 1 according to an example of the present application may include a support unit 10, a luminous element 20, and a wavelength conversion unit 30.

The support unit 10 includes a substrate 11 on which electrodes 12 and 13 are formed, and the luminous element 20 may be mounted on the substrate 11 and electrically connected to the electrodes 12 and 13.

The substrate 11 may be a printed circuit board (PCB), may be made of an organic resin material containing epoxy, triazine, silicon, polyimide, or the like, and any other organic resin materials, or may be made of a ceramic material such as AlN, $Al_2O_3$, or the like, or a metal and a metal compound, and may include a metal-core PCB (MCPCB). Namely, the substrate 11 may be any substrate as long as it has a structure in which the electrodes 12 and 13 for driving the luminous element 20 are formed on the surface thereof on which the luminous element 20 is mounted.

The electrodes 12 and 13 may be formed on the surface of the substrate 11 and connected to the luminous element 20 to supply power. At least a pair of electrodes 12 and 13 may be formed on the substrate 11 and electrically connected to the luminous element 20 mounted on the substrate 11. The electrodes 12 and 13 may be made of a metal, e.g., gold (Au), silver (Ag), copper (Cu), or the like, having excellent electrical conductivity and thermal conductivity.

In FIG. 1, it is illustrated that one electrode 12 is provided as a mounting region on which the luminous element 20 is mounted, but the present application is not limited thereto. Namely, although not shown, the luminous element 20 may be mounted on the surface of the substrate 11 or may be mounted on a heat sink (not shown) exposed from the surface of the substrate 11 penetrating thereto. Also, the electrode 12 on which the luminous element 20 is mounted may be outwardly exposed from a bottom surface of the substrate 11.

In the present example, a structure in which the luminous element 20 is directly connected to the electrode 12 provided as a mounting region and is connected to the other electrode 13 through a conductive wire W is illustrated. However, the present application is not limited thereto and the scheme of connecting the luminous element 20 to the electrodes 12 and 13 may include various schemes such as a die-bonding scheme, a flip-chip scheme, and the like.

For example, the luminous element 20 may be electrically connected to the respective electrodes 12 and 13 through a pair of conductive wires (W).

Also, in another example, as shown in FIG. 4, the luminous element 20 may be directly disposed on the electrodes 12 and 13 according to a so-called flip-chip bonding scheme so as to be electrically connected thereto, without using a conductive wire W.

In addition, in the present example, a conductive wire W is illustrated as an example of a wiring structure, but the conductive wire may be replaced by any other types of wiring structures, e.g., a metal line, or the like, as long as they perform an electrical signal transmission function.

In a configuration for providing white light as final output light, light emitted from the light emitting device 20 may have a wavelength range of 380 nm to 500 nm. Namely, the light emitting device 20 may be a UV LED chip or a blue LED chip. In the drawing, it is illustrated that a single light emitting device 20 is provided, but the present application is not limited thereto and a multi-chip array including two or more chips may be provided.

The wavelength conversion unit 30 is formed on the support unit 10 to cover the light emitting device 20 and converts light emitted from the light emitting device 20 into light of a different wavelength. As illustrated, the wavelength conversion unit 30 may be provided on a limited portion of the upper surface of the light emitting device 20, and in this case, a uniform light wavelength converter distribution may be guaranteed in comparison to a configuration in which the wavelength conversion unit 30 is formed to surround the entire area of the light emitting device 20. Also, since the upper surface of the light emitting device 20 is provided as a main light emission surface, even in the case that the wavelength conversion unit 30 is only formed on the upper surface of the light emitting device 20, a sufficient wavelength conversion effect can be obtained.

As shown in FIG. 2, the wavelength conversion unit 30 may include an encapsulant 31 made of a transparent resin, or the like, and light wavelength converters 32 and 33 contained in the encapsulant 31. In the present application, the wavelength conversion unit 30 may include two types of light wavelength converters 32 and 33, each having at least two different types of emission spectrums. The light wavelength converters may include a red phosphor having an emission spectrum ranging from 560 nm to 760 nm as first light wavelength converters 32 and a green phosphor having an emission spectrum ranging from 460 nm to 660 nm as second light wavelength converters 33. The light wavelength converters 32 and 33 may be formed as spherical particles each having a different size.

Figure 5A:
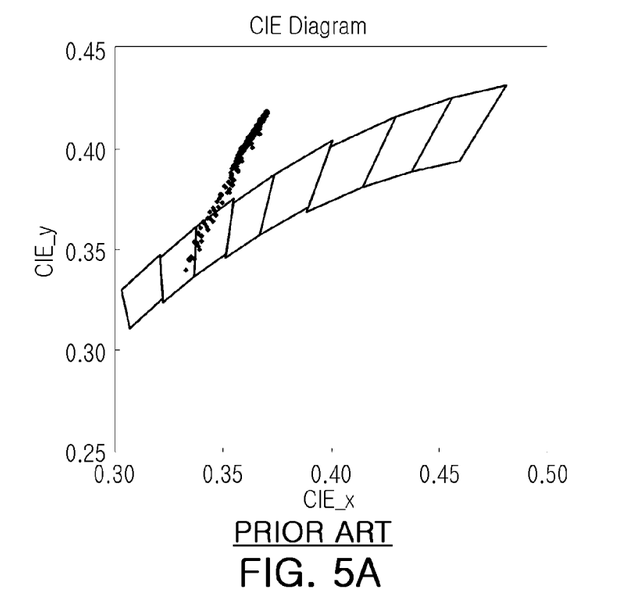
FIG. 5A is a graph showing a related art color distribution scheme.

In the related art, a single phosphor, e.g., a yellow phosphor, may be applied to an LED chip, and such a phosphor is randomly distributed in the vicinity of an LED chip, degrading production yield of a color distribution scheme as shown in FIG. 5A, and thus, inevitably fabricating a product having an undesired color. In addition, luminous efficiency may be degraded.

Thus, in an example of the present application, light emitted from the luminous element 20 is excited to have a converted wavelength by using light wavelength converters. The light wavelength converters include the first light wavelength converters 32 and the second light wavelength converters 33 having mutually different emission spectrums. White light is implemented through a combination of emission spectrums of different wavelengths.

Figure 5B:
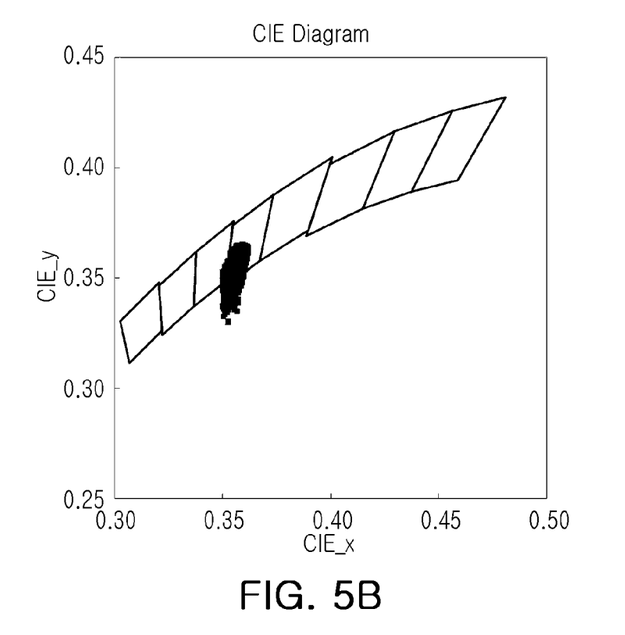
FIG. 5B is a graph showing a color distribution scheme according to an example of the present application.

As shown in FIG. 5B, it can be seen that the yield of a color distribution scheme is improved in comparison to a color distribution scheme according to an emission spectrum of a single phosphor in the related art. In addition, an implementation of white light by mixing colors of different emission spectrums has an advantage in which a color rendering index (CRI) is easily controlled.

Meanwhile, in order to prevent a reduction in the quantity of final light, a relatively large amount of the first light wavelength converters 32 are distributed in a lower region of the wavelength conversion unit 30 adjacent to the luminous element 20 and a relatively large amount of the second light wavelength converters 33 are distributed in an upper region of the wavelength conversion unit 30, forming a structure similar to a stacked structure.

As shown in FIGS. 2A and 2B, the wavelength conversion unit 30 may include a first mixture region adjacent to the luminous element 20 and a second mixture region above the first mixture region. As for a distribution gradient, a relatively large amount of the first light wavelength converters 32 are distributed in the first mixture region, and a relatively large amount of the second light wavelength converters 33 are distributed in the second mixture region.

In detail, the first light wavelength converters 32 emitting light having a relatively longer wavelength, i.e., red light, may be concentratively distributed in the first mixture region, a lower region of the encapsulant 31 in proximity to the luminous element 20, and the second light wavelength converters 33 emitting light having a relatively shorter wavelength, e.g., green light, are concentratively distributed in the upper second mixture region. In this manner, the distribution gradient is formed in order of the first light wavelength converters 32 and the second light wavelength converters 33 based on relative wavelength conversion efficiency along the path on which light is emitted, whereby light emitted from the luminous element 20 is converted by the first light wavelength converters 32 and the converted light is next converted by the second light wavelength converters 33, thus implementing white light.

Thus, since the first light wavelength converters 32 emitting red light having the lowest wavelength conversion efficiency are largely distributed in proximity to the luminous element 20, wavelength conversion efficiency can be relatively increased, and accordingly, the overall wavelength conversion efficiency of the wavelength conversion unit 30 can be enhanced. Owing to the increase in wavelength conversion efficiency, a reduction in the quantity of light can be prevented.

In the case of the wavelength conversion unit 30 according to the present example, the first light wavelength converters 32 and the second light wavelength converters 33 contained in the encapsulant 31 constituting the wavelength conversion unit 30 are deposited and distributed to have different depths, forming a structure similar to a stacked structure. Namely, the wavelength conversion unit 30 does not have a configuration in which the wavelength conversion unit containing the first light wavelength converters 32 and the wavelength conversion unit containing the second light wavelength converters 33, both as independent converters, are stacked to form an interface therebetween, but have a configuration in which the first light wavelength converters 32 and the second light wavelength converters 33 integrally mixed in the same encapsulant 31 are distributed to be concentrated on different regions through deposition, respectively, forming a distribution gradient structure similar to a stacked structure without an interface. Thus, there is no need to perform an additional process or an extra procedure to form the distribution gradient of the light wavelength converters 32 and 33, and the structure is advantageously simplified.

The distribution gradient conditions of the foregoing respective light wavelength converters 32 and 33 may be obtained by depositing the first light wavelength converters 32 faster than the second light wavelength converters 33 in the process of forming the wavelength conversion unit 30. Due to the difference in the deposition rates, the first light wavelength converters 32 may be implemented to be more concentratively distributed in the first mixture region, the lower region, of the wavelength conversion unit 30, and the second light wavelength converters 33 may be implemented to be more concentratively distributed in the second mixture region, the upper region, of the wavelength conversion unit 30.

The deposition rate for the foregoing distribution gradient may be controlled by adjusting various conditions such as the specific gravity and a grain size of the first light wavelength converters 32 and the second light wavelength converters 33, the viscosity of the encapsulant 31 of the wavelength conversion unit 30, a curing time, and the like. In particular, the distribution gradient required in the present example may be easily realized by appropriately selecting the grain size condition of the first light wavelength converters 32 and the second light wavelength converters 33.

In detail, due to the difference in deposition rates resulting from the difference in average grain sizes of the first light wavelength converters 32 and the second light wavelength converters 33, the first light wavelength converters 32 and the second light wavelength converters 33 may be deposited to be distributed to have different depths, and an average grain size of each of the first light wavelength converters 32 and the second light wavelength converters 33 may be selected according to the size of the specific gravity value of each of the first light wavelength converters 32 and the second light wavelength converters 33.

An average grain size of the first light wavelength converters 32 may be selected from within a range of 10 μm to 30 μm, and an average grain size of the second light wavelength converters 33 may be selected from within a range of 0.1 μm to 10 μm. Preferably, the average grain size of the first light wavelength converters 32 may be selected from within a range of 5 μm to 20 μm, and the average grain size of the second light wavelength converters 33 may be selected from within a range of 0.1 μm to 5 μm.

The first light wavelength converters 32 may have a specific gravity value ranging from 3.0~4.0 g/cm$^3$, and the second light wavelength converters 33 may have a specific gravity value ranging from any one of 3.0~4.0 g/cm$^3$, 4.5~5.5 g/cm$^3$, and 6.0~7.0 g/cm$^3$.

For example, when the first light wavelength converters are comprised of (Sr,Ca)AlSiN and Ca-α-SiAlON having a specific gravity value of 3.0~4.0 g/cm$^3$ and the second light wavelength converters 33 are comprised of β-SiAlON having a specific gravity value of 3.0~4.0 g/cm$^3$, the average grain size of the first light wavelength converters 32 may be selected from within a range of 10 μm to 30 μm, and the average grain size of the second light wavelength converters 33 may be selected from within a range of 0.1 μm to 10 μm.

Also, when the first light wavelength converters 32 are comprised of (Sr,Ca)AlSiN and Ca-α-SiAlON having a specific gravity value of 3.0~4.0 g/cm$^3$ and the second light wavelength converters 33 are comprised of (Sr,Ba)$_2$SiO$_4$ having a specific gravity value of 4.5~5.5 g/cm$^3$ or comprised of Lu$_3$Al$_5$O$_{12}$ having a specific gravity value of 6.0~7.0 g/cm$^3$, the average grain size of the first light wavelength converters 32 may be selected from within a range of 10 μm to 30 μm, and the average grain size of the second light wavelength converters 33 may be selected from within a range of 0.1 μm to 5 μm.

In this manner, by selectively applying the average grain sizes in consideration of the specific gravity values of the light wavelength converters 32 and 33, the deposition rates are induced to be different, whereby even in the case that the first light wavelength converters 32 and the second light wavelength converters 33 are mixedly contained in the encapsulant 31, the distribution gradient may be formed such that the first light wavelength converters 32 are distributed in the first mixture region, the lower region in proximity to the luminous element 20 and the second light wavelength converters 33 are distributed in the upper second mixture region. Since the distribution gradient formed by the light wavelength converters 32 and 33 results from natural deposition of the light wavelength converters 32 and 33 as contained, an additional process of forming a stacked structure is not required. Thus, an extra steps can be advantageously eliminated.

Meanwhile, in the present example, it is illustrated that the wavelength conversion unit 30 is formed to have a uniform thickness on the upper surface of the luminous element 20. The structure of the wavelength conversion unit 30 may be formed by injecting the encapsulant 31 containing the light wavelength converters 32 and 33 onto the wafer, curing the same, performing dicing, and then, singulating it into individual chips.

Also, as shown in FIG. 3, the wavelength conversion unit 30 may be formed by supplying the encapsulant 31 containing the light wavelength converters 32 and 33 to the luminous element 20 through an individual dispensing process. In this case, the wavelength conversion unit 30 may have a structure having a convex lens shape due to surface tension of the encapsulant 31. In particular, viewing angle characteristics and a chromatic distribution, and the like, may be controlled by changing the convex lens structure formed on an upper surface of the luminous element 20 according to viscosity or a thixotropic index of a liquid resin.

The viscosity of the encapsulant 31 containing the light wavelength converters 32 and 33 may be adjusted by the content and/or grain size of the light wavelength converters 32 and 33, as well as the viscosity of the transparent encapsulant 31 itself. For example, as the content of the light wavelength converters 32 and 33 is increased and the grain size of the light wavelength converters 32 and 33 is reduced, the viscosity and thixotropic index of the encapsulant 31 containing the light wavelength converters 32 and 33 can be increased, and resultantly, the curvature of the lens shape will be increased by the great surface tension. In the opposite case, the wavelength conversion unit 30 having a lens shape with a small curvature or a small contact angle may be obtained.

Figure 6:
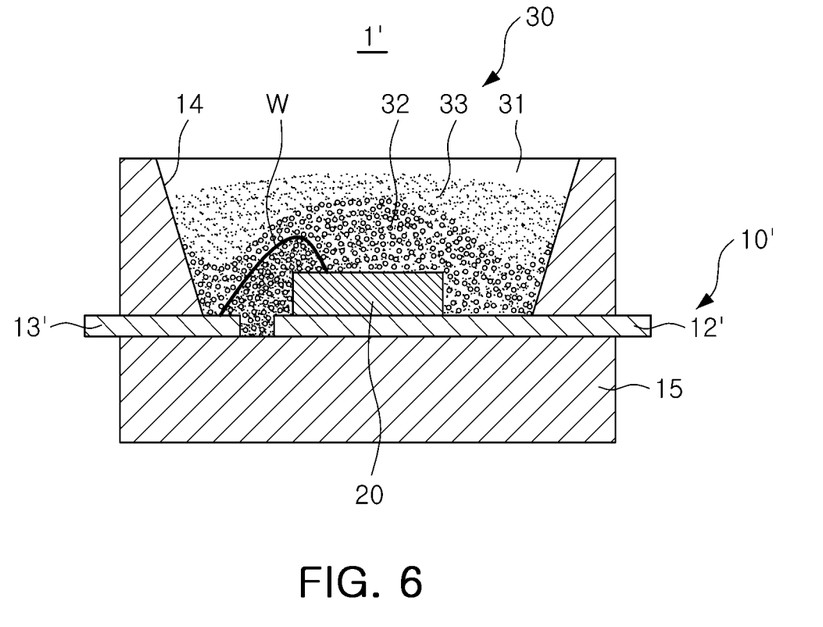
FIG. 6 is a cross-sectional view schematically showing a light emitting device according to another example of the present application.

A light emitting device according to another example of the present application will be described with reference to FIG. 6. A basic configuration of the light emitting device according to the example illustrated in FIG. 6 is substantially the same as that of the example illustrated in FIG. 1, except for the structure of a support unit and a wavelength conversion unit. Thus, hereinafter, a description of portions the same as those of the former example will be omitted, and the configuration of the support unit and the wavelength conversion unit will mainly be described.

FIG. 6 is a cross-sectional view schematically showing a light emitting device 1' according to another example of the present application.

As shown in FIG. 6, a support unit 10' may include a main body 15 with a cavity 14 formed therein and lead frames 12' and 13' of which portions are exposed within the cavity 14. The luminous element 20 may be placed within the cavity 14 and electrically connected to the lead frames 12' and 13'.

The main body 15 may be formed by injection-molding a resin as an insulating material, or the like, or by firing ceramics. However, a material used for forming the main body 15 is not particularly limited, and any material may be used to form the main body 15 as long as it has electric insulation properties, excellent heat dissipation performance and light reflectivity.

The cavity 14 having a reflective cup shape may be formed on an upper surface of the main body 15 such that it can accommodate the luminous element 20 therein. Here, the upper surface refers to a surface formed by the main body 15 when the main body 15 is viewed from above. Terms such as an 'upper surface', 'lower surface', 'lateral surface', or the like, used in the present disclosure are based on the drawings, and such terms may be changed according to a direction in which an apparatus is actually disposed.

The cavity 14 may have a tapered structure in which a sectional area thereof is gradually increased toward an upper surface of the main body 15, and a reflective layer (not shown) having high light reflectivity may be provided on the surface thereof in order to enhance light extraction efficiency.

Portions of the lead frames 12' and 13' may be exposed within the cavity 14 in order to be electrically connected to the luminous element 20 placed within the cavity 14. In the drawing, it is illustrated that the luminous element 20 is mounted on the lead frame 12', but the present application is not limited thereto. Namely, although not shown, the luminous element 20 may be placed on a bottom surface of the cavity 14 and electrically connected to the lead frames 12' and 13', or may be placed on a heat sink (not shown) exposed within the cavity 14 through the main body 15. Also, in order to enhance heat dissipation efficiency, the lead frame 12' with the luminous element 20 mounted thereon may be outwardly exposed from a bottom surface of the main body 15.

In the present example, the structure in which the luminous element 20 is mounted on one lead frame 12' exposed within the cavity 14 and directly connected thereto and electrically connected to the other lead frame 13' through a conductive wire (W) is illustrated. However, the present application is not limited thereto and the scheme of connecting the luminous element 20 and the lead frames 12' and 13' may vary. Namely, the luminous element 20 and the lead frames 12' and 13' may be connected according to a die-bonding scheme, a flip-chip scheme, or the like.

For example, the luminous element 20 may be electrically connected to the respective lead frames 12' and 13' through a pair of conductive wires (W).

In another example, the luminous element 20 may be directly disposed on the lead frames 12' and 13' according to a so-called flip-chip bonding scheme without using a conductive wire.

In addition, in the present example, the conductive wire (W) is illustrated as an example of a wiring structure, but the wire may be replaced with a different type of wiring structure, e.g., a metal line, or the like, as long as it can perform an electrical signal transmission function.

The wavelength conversion unit 30 may be formed to have a structure in which it fills the cavity 14 to integrally cover the luminous element 20 together with the wire (W). Accordingly, the wavelength conversion unit 30 may protect the luminous element 20 and the wire (W) against the outer environment and convert light emitted from the luminous element 20 into white light.

The wavelength conversion unit 30 may include the encapsulant 31 made of a transparent resin and the light wavelength converters 32 and 33 as phosphors contained in the encapsulant 31. In the present example, the wavelength conversion unit 30 may include two types of light wavelength converters 32 and 33 each having at least two different emission spectrums. The light wavelength converters may be first light wavelength converters 32 having an emission spectrum ranging from 560 nm to 760 nm and second light wavelength converters 33 having an emission spectrum ranging from 460 nm to 660 nm.

The first light wavelength converters 32 are concentratively distributed in the first mixture region, a lower region of the wavelength conversion unit 30 adjacent to the luminous element 20 and the second light wavelength converters 33 are concentratively distributed in the second mixture region above the light wavelength converters 32, an upper region of the wavelength conversion unit 30, forming a structure similar to a stacked structure.

In detail, the first light wavelength converters 32 emitting light having a relatively longer wavelength, i.e., red light, may be mainly distributed in the first mixture region, a lower region in proximity to the luminous element 20; and the second light wavelength converters 33 emitting light having a relatively shorter wavelength, e.g., green light, may be mainly distributed in the upper second mixture region. In this manner, the first light wavelength converters and the second light wavelength converters 33 are distributed in this order based on relative wavelength conversion efficiency along the path on which light is emitted, whereby light emitted from the luminous element 20 is converted by the first light wavelength converters 32 and the converted light is converted by the second light wavelength converters 33, thus implementing white light.

Thus, since the first light wavelength converters 32 emitting red light having the lowest wavelength conversion efficiency are distributed to be closest to the luminous element 20, wavelength conversion efficiency can be relatively increased, and accordingly, the overall wavelength conversion efficiency of the wavelength conversion unit 30 can be enhanced.

In the case of the wavelength conversion unit 30 according to the present example, the first light wavelength converters 32 and the second light wavelength converters 33 contained in the encapsulant 31 constituting the wavelength conversion unit 30 are deposited to have different depths, forming a distribution gradient having a sort of stacked structure.

The deposition rate for the foregoing distribution gradient may be controlled by adjusting various conditions such as the specific gravity and a grain size of the first light wavelength converters 32 and the second light wavelength converters 33, the viscosity of the encapsulant 31 of the wavelength conversion unit 30, a curing time, and the like. In particular, the distribution gradient required in the present example may be easily realized by appropriately selecting the grain size condition of the first light wavelength converters 32 and the second light wavelength converters 33.

The specific gravity and grain size conditions of the first light wavelength converters 32 and the second light wavelength converters 33 have been described in detail in the former examples of FIGS. 1 through 4, so a description thereof will be omitted.

Figure 7:
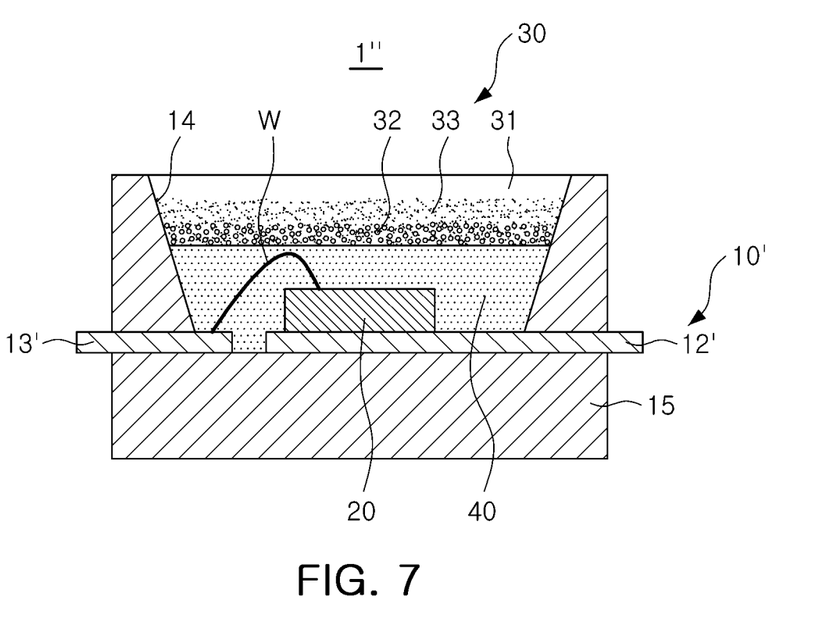
FIG. 7 is a cross-sectional view schematically showing a light emitting device according to another example of the present application.

A light emitting device according to another example of the present application will be described with reference to FIG. 7. A basic configuration of the light emitting device according to the example illustrated in FIG. 7 is substantially the same as that of the example illustrated in FIG. 6, except for the structure of a wavelength conversion unit. Thus, hereinafter, a description of portions the same as those of the former example will be omitted, and the configuration of the wavelength conversion unit will be mainly described.

FIG. 7 is a cross-sectional view schematically showing a light emitting device 1" according to another example of the present application.

As shown in FIG. 7, a transparent resin unit 40 made of a transparent resin is formed within the cavity 14 of the main body 15 to fill a portion of the cavity 14 to encapsulate and protect the luminous element 20 and the wire. Preferably, the transparent resin unit 40 may be formed up to a position higher than the top of the wire. The transparent resin unit 40 may contain a dispersing agent (not shown) for spreading light.

The wavelength conversion unit 30 may be formed on the transparent resin unit 40. Namely, the wavelength conversion unit 30 may be formed to have a structure in which it fills the region remaining after the cavity 14 is filled with the transparent resin unit 40. Accordingly, the cavity 14 may be completely filled by the transparent resin unit 40 and the wavelength conversion unit 30.

In this manner, when the wavelength conversion unit 30 and the luminous element are formed to have a structure in which they are separated, deformation of the light wavelength converters 32 and 33 by heat generated from the luminous element 20 can be prevented.

As set forth above, according to examples of the application, a light emitting device having an improved color distribution yield, color rendition that can be easily controlled, and improved luminous efficiency can be provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light emitting device comprising:
a support unit;
a luminous element disposed on the support unit; and
a wavelength conversion unit disposed on the support unit to cover the luminous element as an encapsulant containing first light wavelength converters emitting light of a first wavelength and second light wavelength converters emitting light of a second wavelength, the first wavelength being larger than the second wavelength, wherein:
the wavelength conversion unit includes a first mixture region and a second mixture region, the first mixture region interposed between the luminous element and the second mixture region,
the first light wavelength converters are concentratively distributed in the first mixture region,
the second light wavelength converters are concentratively distributed in the second mixture region,
the first light wavelength converters and the second light wavelength converters are deposited to have different depths according to an average grain size of each of the light wavelength converters, and
a specific gravity value of the first light wavelength converters is in a same range as that of the second light wavelength converters, or is less than that of the second light wavelength converters.

2. The light emitting device of claim 1, wherein:
the wavelength conversion unit has different distribution gradients in the first and second mixture regions due to a difference in deposition rates of the first light wavelength converters and the second light wavelength converters contained in the encapsulant.

3. The light emitting device of claim 1, wherein:
average grain sizes of the first light wavelength converters and the second light wavelength converters are selected according to a magnitude of the specific gravity value of each of the first light wavelength converters and the second light wavelength converters.

4. The light emitting device of claim 3, wherein:
the specific gravity value of the first light wavelength converters ranges from 3.0~4.0 g/cm$^3$, and
the specific gravity value of the second light wavelength converters ranges from any one of 3.0~4.0 g/cm$^3$, 4.5~5.5 g/cm$^3$, and 6.0~7.0 g/cm$^3$.

5. The light emitting device of claim 3, wherein:
the average grain size of the first light wavelength converters is selected from within a range of 10 μm to 30 μm, and
the average grain size of the second light wavelength converters is selected from within a range of 0.1 μm to 10 μm.

6. The light emitting device of claim 3, wherein:
when the specific gravity value of the first light wavelength converters ranges from 3.0~4.0 g/cm$^3$, the average grain size of the first light wavelength converters is selected from a range of 10 μm to 30 μm,
when the specific gravity value of the second light wavelength converters ranges from 3.0 ~4.0 g/cm$^3$, the average grain size of the second light wavelength converters is selected from a range of 0.1 μm to 10 μm, and
when the specific gravity value of the second light wavelength converters ranges from 4.5~5.5 g/cm$^3$ and 6.0~7.0 g/cm$^3$, the average grain size of the second light wavelength converters is selected from a range of 0.1 μm to 5 μm.

7. The light emitting device of claim 1, wherein:
the first light wavelength converters include (Sr,Ca)AlSiN and Ca-α-SiAlON, and
the second light wavelength converters include β-SiAlON, (Sr,Ba)$_2$SiO$_4$, and Lu$_3$Al$_5$O$_{12}$.

8. The light emitting device of claim 1, wherein:
the support unit includes a substrate with an electrode formed thereon, and
the luminous element is placed on the substrate and connected to the electrode.

9. The light emitting device of claim 1, wherein:
the support unit includes a main body with a cavity formed therein and a lead frame exposed within the cavity, and
the luminous element is placed in the cavity and connected to the lead frame.

10. A light emitting device comprising:
a support unit including a main body and cavity formed therein;
a luminous element disposed within the cavity; and
a wavelength conversion unit substantially filling the cavity, the wavelength conversion unit disposed on the support unit to cover the luminous element as an encapsulant containing first light wavelength converters emitting light of a first wavelength and second light wavelength converters emitting light of a second wavelength, the first wavelength being larger than the second wavelength, wherein:
the wavelength conversion unit includes a first mixture region and a second mixture region, the first mixture region interposed between the luminous element and the second mixture region,
the first light wavelength converters are concentratively distributed in the first mixture region,
the second light wavelength converters are concentratively distributed in the second mixture region, the first light wavelength converters and the second light wavelength converters are deposited to have different depths according to an average grain size of each of the light wavelength converters, and a specific gravity value of the first light wavelength converters is in a same range as that of the second light wavelength converters, or is less than that of the second light wavelength converters.

11. The light emitting device of claim 10, wherein the cavity has a reflective cup shape.

12. The light emitting device of claim 10, wherein:
the encapsulant comprises a transparent resin; and
the first and second light wavelength converters are phosphors.

13. The light emitting device of claim 12, wherein:
the first light wavelength converters have an emission spectrum of 560 nm to 760 nm, and
the second light wavelength converters have an emission spectrum of 460 nm to 660 nm.

14. The light emitting device of claim 10, wherein:
the specific gravity value of the first light wavelength converters ranges from 3.0~4.0 g/cm$^3$, and
the specific gravity value of the second light wavelength converters ranges from any one of 3.0~4.0 g/cm$^3$, 4.5~5.5 g/cm$^3$, and 6.0~7.0 g/cm$^3$.

15. The light emitting device of claim 10, wherein:
the average grain size of the first light wavelength converters is selected from within a range of 10 μm to 30 μm, and
the average grain size of the second light wavelength converters is selected from within a range of 0.1 μm to 10 μm.

16. The light emitting device of claim 10, wherein:
when the specific gravity value of the first light wavelength converters ranges from 3.0~4.0 g/cm$^3$, the average grain size of the first light wavelength converters is selected from a range of 10 μm to 30 μm, when the specific gravity value of the second light wavelength converters ranges from 3.0~4.0 g/cm$^3$, the average grain size of the second light wavelength converters is selected from a range of 0.1 μm to 10 μm, and when the specific gravity value of the second light wavelength converters ranges from 4.5~5.5 g/cm$^3$ and 6.0~7.0 g/cm$^3$, the average grain size of the second light wavelength converters is selected from a range of 0.1 μm to 5 μm.

* * * * *